United States Patent
Shi et al.

(10) Patent No.: US 6,894,503 B2
(45) Date of Patent: May 17, 2005

(54) PRECONDITIONAL QUIESCENT CURRENT TESTING OF A SEMICONDUCTOR DEVICE

(75) Inventors: Jiang Shi, Plano, TX (US); Jiang Yu, Plano, TX (US); Agapito Benavides, III, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/636,333

(22) Filed: Aug. 7, 2003

(65) Prior Publication Data

US 2004/0207408 A1 Oct. 21, 2004

Related U.S. Application Data

(60) Provisional application No. 60/463,023, filed on Apr. 15, 2003.

(51) Int. Cl.$^7$ ............................................. G01R 31/26
(52) U.S. Cl. ........................ 324/537; 324/765; 714/724; 714/30
(58) Field of Search ................................. 324/537, 765, 324/763, 158.1; 714/724, 726, 730, 4, 30; 326/93; 702/57, 58

(56) References Cited

U.S. PATENT DOCUMENTS 5,644,251 A     7/1997  Colwell et al. ............... 326/16
5,670,890 A     9/1997  Colwell et al. ............. 324/765
6,765,414 B2 *  7/2004  Keshavarzi et al. .......... 326/93

OTHER PUBLICATIONS

Rochit Rajsuman, "Design–for–Iddq–Testing for Embedded Cores Based System–on–a–Chip", O–8186–9191–3/98, © 1998 IEEE, pp. 69–73.

Digest of Papers, IEEE International Workshop on IDDQ Testing, 1995, edited by Y. K. Malaiya and A. P. Jayasumana, IEEE Computer Society Technical Committee on Test Technology, Washington, D.C., 5 pages, Oct. 25–26, 1995.

* cited by examiner

Primary Examiner—Vincent Q. Nguyen
(74) Attorney, Agent, or Firm—Yingsheng Tung; Wade James Brady, III; Frederick J. Telecky, Jr.

(57) ABSTRACT

A method for testing a semiconductor device is included where sleep mode commands associated with the semiconductor device are generated. The semiconductor device includes logic blocks, where a sleep mode command sets a logic block in a sleep mode. A sleep mode sequence associated with the logic blocks of the semiconductor device is determined. The sleep mode commands are executed according to the sleep mode sequence by applying the sleep mode commands to the logic blocks. A quiescent current corresponding to the semiconductor device is measured in order to test the semiconductor device.

16 Claims, 1 Drawing Sheet

PRECONDITIONAL QUIESCENT CURRENT TESTING OF A SEMICONDUCTOR DEVICE

RELATED APPLICATIONS

This application claims benefit under 35 U.S.C. § 119(e) of U.S. Provisional Application Ser. No. 60/463,023, entitled "PRECONDITIONED ATE IDDQ TESTING FOR A SYSTEM-ON-A-CHIP DEVICE," filed Apr. 15, 2003, by Jiang Shi, et al.

TECHNICAL FIELD OF THE INVENTION

This invention relates generally to the field of semiconductor testing and more specifically to preconditional quiescent current testing of a semiconductor device.

BACKGROUND OF THE INVENTION

Testing a semiconductor device generally includes performing a quiescent current (IDDQ) test. IDDQ testing of some semiconductor devices, however, may yield unstable and unreliable results. For example, a system-on-chip (SOC) device may comprise a large amount of integrated cores and transistors that may yield a significant leakage current during IDDQ testing. Ignoring the leakage current may yield inaccurate performance predictions of the SOC device. The leakage current may be reduced or eliminated by powering down the logic blocks of the semiconductor device.

A known technique for performing IDDQ testing involves designing the SOC device with separate power supplies for each logic block of the semiconductor device so that each logic block may be powered down. This known technique, however, requires that the device have multiple dedicated power supplies, which may result in increased size of the package, increased number of pins, extended design cycle, and delayed ramp-to-production (RTP) time. Moreover, semiconductor devices with an insufficient number of dedicated power supplies may require alteration. Consequently, known techniques for IDDQ testing of a semiconductor device are unsatisfactory in certain situations.

SUMMARY OF THE INVENTION

In accordance with the present invention, disadvantages and problems associated with previous techniques for quiescent current testing of a semiconductor device may be reduced or eliminated.

According to one embodiment, testing a semiconductor device includes generating sleep mode commands associated with the semiconductor device. The semiconductor device includes logic blocks, where a sleep mode command sets a logic block in a sleep mode. A sleep mode sequence associated with the logic blocks of the semiconductor device is determined. The sleep mode commands are executed according to the sleep mode sequence by applying the sleep mode commands to the logic blocks. A quiescent current corresponding to the semiconductor device is measured in order to test the semiconductor device.

Certain embodiments of the invention may provide one or more technical advantages. A technical advantage of one embodiment may be that using precondition patterns to prepare a semiconductor device for IDDQ testing may allow for testing of a wide variety of semiconductor devices, which may reduce the need for specialty designed semiconductor device. Another technical advantage of one embodiment may be that more reliable IDDQ test results may be obtained by reducing the probability of leakage currents through the application of the precondition patterns. Yet another technical advantage of one embodiment may be that the cost and size of a semiconductor package may be reduced by reducing or eliminating the need for dedicated power supplies used to test the quiescent current.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
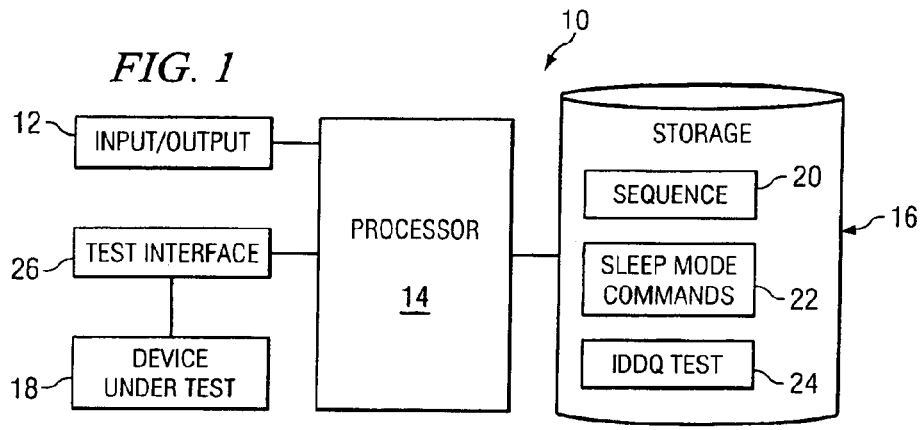
FIG. 1 is a block diagram of one embodiment of a test system that may be used in accordance with the present invention.
Figure 2:
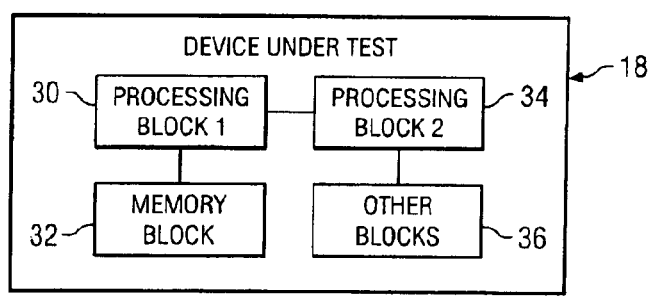
FIG. 2 is a block diagram of one embodiment of a semiconductor device that may be tested using the test system of FIG. 1.
Figure 3:
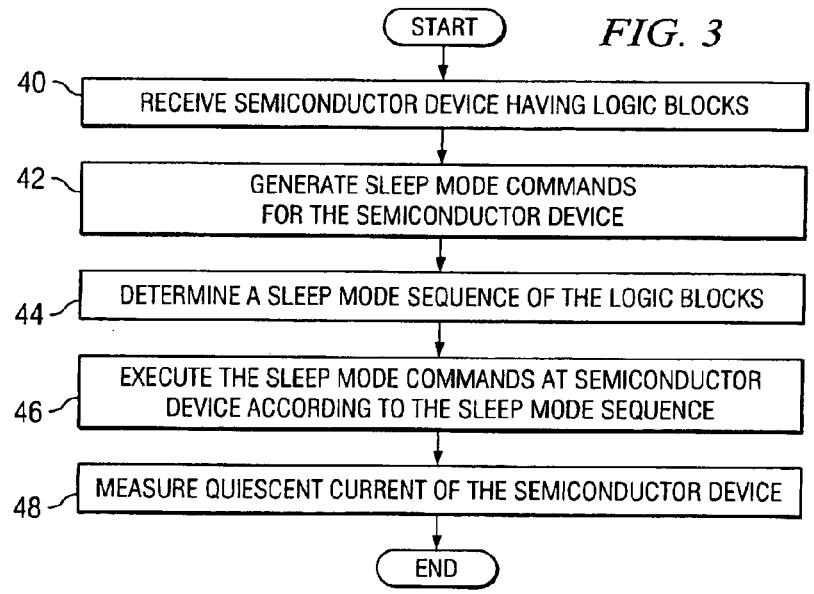
FIG. 3 is a flowchart demonstrating one embodiment of a method for testing a semiconductor device that may be used in accordance with the present invention.

Embodiments of the present invention and its advantages are best understood by referring to FIGS. 1 through 3 of the drawings, like numerals being used for like and corresponding parts of the various drawings.

FIG. 1 is a block diagram of one embodiment of a test system 10 that may be used in accordance with the present invention. In general, test system 10 generates sleep mode patterns that may be applied to logic blocks of a semiconductor device 18 in a predetermined sequence in order to test the quiescent current (IDDQ) of semiconductor device 18. According to the illustrated embodiment, system 10 includes an Input/Output module 12, a processor 14, storage 16, a test interface 26, and semiconductor device 18 coupled as shown in FIG. 1.

Input/Output (I/O) module 12 receives input from a user and communicates output to the user. I/O module 12 may include devices such as a keyboard, a mouse, a touch screen, a pointing device, a scanner, a printer, disk drives, a display, one or more communication links, or any other suitable device. According to one embodiment, I/O module 12 may receive a message from the user to perform a test of semiconductor device 18. For example, I/O module 12 may receive a message to precondition semiconductor device 18 for IDDQ testing.

Processor 14 may execute programs that may be stored at storage 16. For example, processor 20 may generate sleep mode commands in response to a message to precondition semiconductor device 18 for IDDQ testing. According to one embodiment, processor 20 may generate sleep mode commands according to instructions from a user received via I/O module 12.

According to another embodiment, processor 20 may execute programs such as sleep mode commands from storage 16. Processor 20 and storage 16 may be housed at a computer that includes software for testing semiconductor device 18. As used in this document "computer" refers to any suitable device operable to accept input, process the input according to predefined rules, and produce output, for example, a personal computer, a work station, a network computer, a wireless telephone, a personal digital assistant, one or more microprocessors within these or other devices, or any other suitable processing device. Additionally, the computer may be adapted to execute MS-DOS, PC-DOS, OS2, UNIX, MAC-OS, or Windows operating systems or any other suitable operating system.

Storage 16 may include Random Access Memory (RAM), Read Only Memory (ROM), a magnetic drive, a disk drive, a Compact Disk (CD) drive, a Digital Video Disk (DVD) drive, removable media storage, any other suitable data storage device, or a combination of any of the preceding. Memory 16 may be coupled to processor 14 and I/O module 12 using a bus connection, a local area network (LAN), a metropolitan area network (MAN), a wide area network (WAN), a global computer network such as the Internet, or any other appropriate wire line, wireless, or other link.

Storage 16 includes a sequence 20, one or more sleep mode commands 22, and an IDDQ test 24. According to one embodiment, sequence 20 may be stored in one or more data files, and sleep mode commands 22 and IDDQ test 24 may be stored in one or more executable files. Storage 16 may include other or additional modules without departing from the scope of the invention.

Sequence 20 describes a sequence order according to which logic blocks of a semiconductor device are set in a sleep mode. According to one embodiment, sequence 20 comprises a precondition sequence that may be followed in order to power down the logic blocks of semiconductor device 18. For example, sequence 20 may comprise a precondition sequence according to which a memory block of semiconductor device 18 is powered down prior to other logic blocks of semiconductor device 18. Any other suitable precondition sequence may be used without departing from the scope of the invention.

Sleep mode commands 22 include commands that may be used to set the logic blocks of semiconductor device 18 in a sleep mode. According to one embodiment, each logic block of semiconductor device 18 may be associated with a test pattern comprising a set of sleep mode commands that may be executed to power down the logic block. A different test pattern may be used for each logic block. For example, one test pattern may be used for a memory block, while another test pattern may be used for a DSP core. Logic blocks, however, may use substantially similar test patterns without departing from the scope of the invention.

Sleep mode commands 22 may include function commands and scan commands. A function command may be used to set logic blocks in a sleep mode by accessing a function test pin at semiconductor device 18. A function command may comprise a portion of a standard IDDQ test procedure used in Automatic Test Equipment (ATE). According to one embodiment, a function command may comprise a set of CPU based function commands that may be used to control a CPU bist memory of semiconductor device 18. For example, the CPU based function commands may set the internal memory of semiconductor device 18 in a sleep mode the internal memory of a semiconductor device 18 by writing a set of uniform bits, either ones ("1") or zeros ("0") into a memory data bus. It may be understood that the CPU function commands may be generated using C language programming, or any other programming language suitable to read and write bits into memory blocks of semiconductor device 18.

According to one embodiment, a scan command may be used to set logic blocks in a sleep mode by accessing a scan test pin at a semiconductor device 18. A scan command may comprise a portion of a standard IDDQ test procedure used in a standard ATE. Any other sleep mode command suitable for setting the logic blocks of a semiconductor device 18 in a sleep mode may be used without departing from the scope of the invention.

IDDQ test 24 includes instructions that test system 10 may use to perform an IDDQ test for semiconductor device 18. For example, IDDQ test 24 may comprise procedures that an ATE may perform to measure the quiescent current of semiconductor device 18. Processor 14 may use the instructions of IDDQ test 24 to perform the quiescent current measurement by prompting a test interface 26 to measure the quiescent current after the logic blocks of semiconductor device 18 have been put in sleep mode.

Test interface 26 receives sleep mode commands 22 from storage 16 and performs an IDDQ test at semiconductor device 18 as instructed by processor 20. According to one embodiment, processor 20 may facilitate the upload of sleep mode commands 22 at test interface 26 using sequence 20 so that test interface 26 may apply the sleep mode commands 22 to the logic blocks in the order specified by sequence 20.

Test interface 26 may start and stop the system clocks of semiconductor device 18. According to one embodiment, in order to precondition semiconductor device 18 for IDDQ testing, test interface 26 may stop the system clock in order to lock the internal clocks of the logic blocks. For example, after applying sleep mode commands 22 to a processing block of semiconductor device 18, test interface 26 may lock the processing block's clock and reset the clock to precondition the processing block for IDDQ testing.

Semiconductor device 18 is coupled to test interface 26 and receives sleep mode commands 22 to set the logic blocks in sleep mode. For example, semiconductor device 18 may receive from test interface 26 a test pattern that may be used to set a memory block in sleep mode. Semiconductor device 18 may be equipped with pin connections that may enable test pattern reception. For example, semiconductor device 18 may include a function-based test pin that may enable function commands to be received and applied to a logic block of semiconductor device 18.

According to one embodiment, semiconductor device 18 comprises a system-on-chip (SOC) device, such as the AV7200 produced by TEXAS INSTRUMENTS. Any other semiconductor device having logic blocks suitable for IDDQ testing may be used without departing from the scope of the invention. Semiconductor device 18 is more particularly described with reference to FIG. 2.

Modifications, additions, or omissions may be made to test system 10 without departing from the scope of the invention. For example, test system 10 may include additional test interfaces 26 to test multiple semiconductor devices 18. According to one embodiment, test system 10 may comprise a Fusion tester, provided by LTX, INC. Additionally, functions may be performed using any suitable logic comprising software, hardware, other logic, or any suitable combination of the preceding.

A block diagram of one embodiment of semiconductor device 18 that may be tested using test system 10 of FIG. 1 is described with reference to FIG. 2. A flowchart demonstrating one embodiment of a method for testing semiconductor device 18 that may be used in accordance with the present invention is described with reference to FIG. 3. "Each" as used in this document refers to each member of a set or each member of a subset of a set.

FIG. 2 is a block diagram of one embodiment of a semiconductor device 18 that may be tested using test system 10 of FIG. 1. Semiconductor device 18 may include a first processing block 30, a second processing block 34, a memory block 32, and other logic blocks 36, coupled as shown in FIG. 2.

First processing device 34 may be set in sleep mode in response to scan commands. According to one embodiment, test interface 26 may apply scan commands to a scan-based test pin of semiconductor device 18 to set first processing block 30 in a sleep mode. Second processing block 34 may be set in sleep mode in response to function commands. According to one embodiment, test interface 26 may apply function commands to a function-based test pin of semiconductor device 18 to set second processing block 30 in a sleep mode. The scan commands and function commands may be received in Test Description Language (TDL) that first processing block 30 and second processing block 34 may interpret to power down. According to one embodiment, first processing block 30 comprises an RISC CPU and second processing block 34 comprises a Digital Signal Processing (DSP) core. It will be understood, that processing blocks 30 and 34 may comprise other suitable processing devices.

Memory block 32 receives function commands that may be used to set memory block 32 in a sleep mode. Memory block 32 may be set in sleep mode by writing into the memory databus a uniform set of bits, as was described with reference to FIG. 1. According to one embodiment, memory block 32 comprises Random Access Memory (RAM) that includes repairable memory and non-repairable memory that may require access synchronization in order to test the quiescent current. In that embodiment, the repairable memory and the non-repairable memory may be placed in substantially the same state throughout the test process. For example, bit "0" may be written in the memory databus for all repairable and non-repairable memory, or bit "1" may be written for all repairable and non-repairable memory. Any other suitable pattern of bits "1" and "0" may be used to precondition the memory block 32 prior to testing the quiescent current.

According to another embodiment, function commands associated with memory block 32 are executed to set basic blocks of memory block 32 in sleep mode in a specific order. For example, a C program may be used to write the uniform bits in the memory databus of memory block 32 in the following basic block order: Video decoder, TPP (MEG transport decoder), Video (PAL/NTSC?RGB?CVBS and CCIR656 video outputs), Audio, On-Screen-Display (OSC), Extension Bus Interface (EBI), and PCI. Any other suitable basic block order may be used without departing from the scope of the invention.

According to one embodiment, memory block 32 is set in sleep mode prior to setting the other logic blocks of semiconductor device 18 in sleep mode. For example, the RISC CPU core and the DSP core may be used to control the application of the function commands at the CPU bist memory of memory block 32. Accordingly, memory block 32 may be preconditioned prior to preconditioning first processing block 30 and second processing block 34. Other logic blocks 36 may be ignored during preconditioning and IDDQ testing as their leakage current and test variation may not substantially affect the results of the quiescent current test.

Modifications, additions, or omissions may be made to semiconductor device 18 without departing from the scope of the invention. For example, semiconductor device 18 may include more or fewer processing blocks. Additionally, functions may be performed using any suitable logic comprising software, hardware, other logic, or any suitable combination of the preceding.

FIG. 3 is a flowchart demonstrating one embodiment of a method for testing a semiconductor device that may be used in accordance with the present invention. The method begins at step 40, where a semiconductor device 18 having logic blocks is received.

At step 42, sleep mode commands associated with semiconductor device 18 are generated. According to one embodiment, processor 14 may generate a set of sleep mode commands for each logic block of semiconductor device 18. For example, a set of function commands may be generated for a memory block 32 and second processing block 34, while scan commands may be generated for first processing block 30.

A sleep mode sequence associated with the logic blocks is determined at step 44. As was described with reference to FIG. 1, a sleep mode sequence identifies the order according to which each logic block of semiconductor device 18 is set in sleep mode. According to one embodiment, the sleep mode sequence sets memory block 32 in sleep mode prior to setting first processing block 30 and second processing block 34 in a sleep mode.

At step 46, the sleep mode commands are executed at semiconductor device 18 according to the sequence. Test interface 26 may receive the sleep mode commands for each logic block in the sequence order. For example, test interface 26 may be uploaded with the set of function commands corresponding to memory block 32 before being uploaded with the function command associated with second processing block 34. Processor 14 may direct test interface 26 to execute the sleep mode commands in the order specified during upload. The sleep mode commands may, however, be executed according to any other predetermined order, such as by executing the sleep mode commands according to sequence 20 stored at storage 16.

After preconditioning the logic blocks by setting them in sleep mode, a quiescent current of semiconductor device 18 is measured at step 48. As was described with reference to FIG. 1, an IDDQ test may be performed according to a instructions preset in an ATE. According to one embodiment, the IDDQ test is performed by scanning an IDDQ test pattern set into semiconductor device 18, stopping the chip level clocks, and measuring the quiescent current. After measuring the quiescent current, the method terminates.

Modifications, additions, or omissions may be made to the method without departing from the scope of the invention. For example, a step may be added to store the sleep mode commands and the sequence at storage 16. As another example, a step may be added to display the quiescent current measurement at I/O module 12. Additionally, steps may be performed in any suitable order without departing from the scope of the invention. For example, generating sleep mode commands at step 42 may be performed substantially simultaneously with determining the sleep mode sequence at step 44 so that the sleep mode commands are generated in the order to be uploaded and executed.

Certain embodiments of the invention may provide one or more technical advantages. A technical advantage of one embodiment may be that using precondition patterns to prepare a semiconductor device for IDDQ testing may allow for testing of a wide variety of semiconductor devices, which may reduce the need for specialty designed semiconductor devices. Another technical advantage of one embodiment may be that more reliable IDDQ test results may be obtained by reducing the probability of leakage currents through the application of the precondition patterns. Yet another technical advantage of one embodiment may be that the cost and size of a semiconductor package may be reduced by reducing or eliminating the need for dedicated power supplies used to test the quiescent current.

Although an embodiment of the invention and its advantages are described in detail, a person skilled in the art could make various alterations, additions, and omissions without departing from the spirit and scope of the present invention as defined by the appended claims.

What is claimed is:

1. A method for testing a semiconductor device, comprising:
   generating a plurality of sleep mode commands associated with the semiconductor device, the semiconductor device comprising a plurality of logic blocks, a sleep mode command of the plurality of sleep mode commands operable to set a logic block of the plurality of logic blocks in a sleep mode;
   determining a sleep mode sequence associated with the logic blocks of the semiconductor device, including identifying a sequence order according to which the sleep mode commands are applied to the plurality of logic blocks to set the plurality of logic blocks in a sleep mode;
   executing the sleep mode commands according to the sleep mode sequence by applying the sleep mode commands to the plurality of logic blocks; and
   measuring a quiescent current corresponding to the semiconductor device in order to test the semiconductor device.

2. The method of claim 1, wherein:
   the plurality of logic blocks comprises a memory block and one or more processing blocks; and
   generating the plurality of sleep mode commands further comprises:
      generating a plurality of function commands associated with the memory block; and
      generating a plurality of scan commands associated with the one or more processing blocks.

3. The method of claim 1, wherein determining the sleep mode sequence further comprises establishing a sequence order according to which a first sleep mode command is applied to a memory block of the plurality of logic blocks prior to applying a second sleep mode command to one or more processing blocks.

4. The method of claim 1, wherein executing the sleep mode commands according to the sleep mode sequence by applying the sleep mode commands to the plurality of logic blocks further comprises writing a uniform bit in a memory databus corresponding to the memory block.

5. The method of claim 1, wherein measuring the current of the semiconductor device further comprises performing a quiescent current supply test.

6. A system for testing a semiconductor device, comprising:
   a storage device operable to store a plurality of sleep mode commands associated with the semiconductor device, the semiconductor device comprising a plurality of logic blocks, a sleep mode command of the plurality of sleep mode commands operable to set a logic block of the plurality of logic blocks in a sleep mode; and
   a processor coupled to the storage device arid operable to:
      determine a sleep mode sequence associated with the logic blocks of the semiconductor device;
      identify a sequence order according to which the sleep mode commands are applied to the plurality of logic blocks to set the plurality of logic blocks in a sleep mode;
      execute the sleep mode commands according to the sleep mode sequence by applying the sleep mode commands to the plurality of logic blocks; and
      measure a quiescent current corresponding to the semiconductor device in order to test the semiconductor device.

7. The system of claim 6, wherein:
   the plurality of logic blocks comprises a memory block and one or more processing blocks; and
   the processor is further operable to generate the plurality of sleep mode commands by:
      generating a plurality of function commands associated with the memory block; and
      generating a plurality of scan commands associated with the one or more processing blocks.

8. The system of claim 6, the processor further operable to establish a sequence order according to which a first sleep mode command is applied to a memory block of the plurality of logic blocks prior to applying the second sleep mode command to one or more processing blocks.

9. The system of claim 6, the processor further operable to write a uniform bit in a memory databus corresponding to the memory block.

10. The system of claim 6, the processor further operable to measure the current of the semiconductor device by performing a quiescent current supply test.

11. A software for testing a semiconductor device, the software embodied in a computer-readable medium and operable to:
    generate a plurality of sleep mode commands associated with the semiconductor device, the semiconductor device comprising a plurality of logic blocks, a sleep mode command of the plurality of sleep mode commands operable to set a logic block of the plurality of logic blocks in a sleep mode;
    determine a sleep mode sequence associated with the logic blacks of the semiconductor device;
    identify a sequence order according to which the sleep mode commands are applied to the plurality of logic blocks to set the plurality of logic blocks in a sleep mode;
    execute the sleep mode commands according to the sleep mode sequence by applying the sleep mode commands to the plurality of logic blocks; and
    measure a quiescent current corresponding to the semiconductor device in order to test the semiconductor device.

12. The software of claim 11, wherein:
    the plurality of logic blocks comprises a memory block and one or more processing blocks; and
    the logic further operable to generate the plurality of sleep mode commands by:
       generating a plurality of function commands associated with the memory block; and
       generating a plurality of scan commands associated with the one or more processing blocks.

13. The software of claim 11, the software further operable to determine the sleep mode sequence by establishing a sequence order according to which a first sleep mode command is applied to a memory block of the plurality of logic blocks prior to applying the second sleep mode command to one or more processing blocks.

14. The software of claim 11, the software further operable to write a uniform bit in a memory databus corresponding to the memory block.

15. The software of claim 11, the software further operable to measure the current of the semiconductor device by performing a quiescent current supply test.

16. A method for testing a semiconductor device, comprising:

generating a plurality of sleep mode commands associated with the semiconductor device, the semiconductor device comprising a plurality of logic blocks, the plurality of logic blocks comprising a memory block and one or more processing blocks, a sleep mode command of the plurality of sleep mode commands operable to set a logic block of the plurality of logic blocks in a sleep mode, wherein generating the plurality of sleep commands further comprises:

generating a plurality of function commands associated with the memory block; and generating a plurality of scan commands associated with the one or more processing blocks;

determining a sleep mode sequence associated with the logic blocks of the semiconductor device by:

identifying a sequence order according to which the sleep mode commands are applied to the plurality of logic blocks to set the plurality of logic blocks in a sleep mode; and establishing a sequence order according to which a first sleep mode command is applied to the memory block of the plurality of logic blocks prior to applying the second sleep mode command to the one or more processing blocks;

executing the sleep mode commands according to the sleep mode sequence by applying the sleep mode commands to the plurality of logic blocks, executing the sleep mode commands further comprising writing a uniform bit in a memory databus corresponding to the memory block; and measuring a quiescent current corresponding to the semiconductor device in order to test the semiconductor device, the measurement obtained by performing a quiescent current supply test.

* * * * *